United States Patent
Chen

(10) Patent No.: US 7,425,880 B2
(45) Date of Patent: Sep. 16, 2008

(54) FILTERS WITH IMPROVED REJECTION BAND PERFORMANCE

(75) Inventor: Qiang Richard Chen, Phoenix, AZ (US)

(73) Assignee: TDK Corporation, Tokyo (JP)

( * ) Notice: Subject to any disclaimer, the term of this patent is extended or adjusted under 35 U.S.C. 154(b) by 114 days.

(21) Appl. No.: 11/041,187

(22) Filed: Jan. 20, 2005

(65) Prior Publication Data
US 2006/0158282 A1    Jul. 20, 2006

(51) Int. Cl.
*H03H 7/01* (2006.01)
(52) U.S. Cl. .................................................. 333/185
(58) Field of Classification Search ................. 333/185
See application file for complete search history.

(56) References Cited

U.S. PATENT DOCUMENTS

| | | | |
|---|---|---|---|
| 3,628,057 | A | 12/1971 | Mueller |
| 4,240,052 | A | 12/1980 | Hallford et al. |
| 4,800,347 | A | 1/1989 | Yorita et al. |
| 4,888,568 | A | 12/1989 | Kawaguchi |
| 5,008,956 | A | 4/1991 | Hemmie |
| 5,020,149 | A | 5/1991 | Hemmie |
| 5,323,115 | A | 6/1994 | Werner, Jr. |
| 5,523,729 | A | 6/1996 | Nakai et al. |
| 5,530,411 | A | 6/1996 | Nakata et al. |
| 5,831,497 | A | 11/1998 | Yorita et al. |
| 5,936,490 | A | 8/1999 | Hershtig |
| 6,064,866 | A | 5/2000 | Lange |
| 6,122,533 | A | 9/2000 | Zhang et al. |
| 6,236,292 | B1 | 5/2001 | Hershtig |
| 6,342,825 | B2 | 1/2002 | Hershtig |
| 6,448,873 | B1 * | 9/2002 | Mostov .................. 333/185 |

FOREIGN PATENT DOCUMENTS

WO       WO 99/29038        6/1999

OTHER PUBLICATIONS

"Advanced Coupling Matric Synthesis Techniques for Microwave Filters," Richard J. Cameron,; IEEE Transactions on Microwave Theory and Techniques, vol. 51, No. 1, Jan. 2003, pp. 1-10.
"Direct Synthesis of a New Class of Band Stop Filters," Amari, S. and Rosenberg, U., EEE Transactions on Microwave Theory and Techniques, accepted Jun. 2003, pp. 1-13.
"New Narrow-Band Dual-Mode Bandstop Waveguide Filters," Jing-Ren Qian and Wei-Chen Zhuang, IEEE Transactions on Microwave Theory and Techniques, vol. MTT-31, No. 12, Dec. 1983, pp. 1045-1050.

* cited by examiner

*Primary Examiner*—Stephen E Jones
(74) *Attorney, Agent, or Firm*—Allen J. Moss; Alex Starkovich; Squire, Sanders & Dempsey LLP

(57) ABSTRACT

A filter is delineated that may have an input for receiving an input signal including a plurality of different frequencies and an output for passing an output signal within a first frequency band. The filter may include a circuit coupled between the input of the filter and the output of the filter such that the circuit may add one or more zeros within a second frequency band to increase attenuation of the input signal within the second frequency band. Portions of the filter may be employed to form such a circuit. The filter may be used by an electrical system employing the filter.

17 Claims, 13 Drawing Sheets

FILTERS WITH IMPROVED REJECTION BAND PERFORMANCE

DESCRIPTION OF THE INVENTION

1. Field of the Invention

The present invention relates to systems and methods for filtering a signal, and, more particularly, to filters with improved rejection band performance, and to systems and methods which may employ such filters.

2. Background of the Invention

As used herein and throughout, the terms in quotations below are defined as follows:

a. The term "bandpass filter" may refer to a filter that may pass signals at frequencies within a specified frequency band and may reject signals at frequencies above the specified frequency band, as well as signals at frequencies below the specified frequency band.

b. The term "capacitor" may refer to a structure that may have capacitance, e.g., at least two materials for conducting separated by an insulating material, such as a dielectric, which may store an electrical charge when a potential difference exists between the materials for conducting.

c. The term "circuit" may refer to a path by which electrons may flow and which may include one or more electrical components.

d. The term "cutoff frequency" may refer to a frequency where a filter's magnitude response is less than a peak passband value by a predefined amount, e.g., 3 dB.

e. The term "filter" may refer to a circuit or device that may permit the passing of signals within a specified frequency band and the rejecting of signals at frequencies outside of the specified frequency band.

f. The term "frequency band" may refer to one or more frequency ranges, each frequency range bound by an upper frequency and a lower frequency.

g. The term "highpass filter" may refer to a filter that may pass signals at frequencies above a specified frequency and may reject signals at frequencies below the specified frequency.

h. The term "inductor" may refer to a structure that may have inductance, e.g., a conductor wrapped into a coil to create a magnetic field.

i. The term "lowpass filter" may refer to a filter that may pass signals at frequencies below a specified frequency and may reject signals at frequencies above the specified frequency.

j. The term "passband" may refer to a frequency band in which attenuation may be equal to or less than a designated value in dB, e.g., 3 dB.

k. The term "rejection band" may refer to a frequency band that may be subjected to a specified attenuation of signal strength by a filter.

l. The term "zero" may refer to any value of the variable, (s), given a continuous-time transfer function in the Laplace domain, H(s), or of the variable, (z), given a discrete-time transfer function in the Z-domain, H(z), that forces the numerator of the transfer function to zero.

A measure of filter performance is signal attenuation in a rejection band. A filter providing greater attenuation in a rejection band is typically desired. Another measure of filter performance is rejection-band bandwidth, one usually wanting a wider bandwidth. Yet another measure of filter performance is a roll-off-frequency slope between passband frequencies and rejection band frequencies. A steeper slope for the roll-off frequency edge, i.e., a more rapid roll-off between passband frequencies and rejection band frequencies, is often desired.

To achieve a rapid roll-off-frequency slope between passband frequencies and rejection band frequencies, elliptic type filters may be desired, as compared to Chebyshev or Butterworth-type filters. To achieve greater attenuation of rejection band frequencies, one may employ a plurality of filter sections, effectively forming a filter having a total rejection band attenuation comprising the attenuation sum from each filter section.

A range of challenges may result from using a plurality of filter sections to increase attenuation in a rejection band. First, cross-coupling between filter sections may inhibit attenuation. To limit such cross-coupling, individual filter sections may be isolated by employing a shielding scheme, which may increase the cost and size of the filter. Second, as the number of filter sections increases, so too does the number of components for the overall filter, further raising filter cost and size. Third, increasing the number of filter sections raises the overall insertion loss for the filter in a passband. Thus, using a plurality of filter sections to increase attenuation in a rejection band not only requires more filter components and isolation consideration, raising filter cost, but also increases passband insertion loss.

There is therefore a need for filters overcoming these and other problems of the prior art.

SUMMARY OF THE INVENTION

In accordance with an embodiment of the invention, a device is disclosed comprising a filter having an input for receiving an input signal including a plurality of different frequencies and an output for passing an output signal within a first frequency band, and a circuit coupled between the input of the filter and the output of the filter, wherein the circuit is for adding one or more zeros within a second frequency band to increase attenuation of the input signal within the second frequency band.

In accordance with another embodiment of the invention, a device is disclosed comprising a filter having an input for receiving an input signal including a plurality of different frequencies and an output for passing an output signal within a first frequency band, and an electrical device comprising a first portion of the filter and a second portion of the filter, wherein the electrical device is formed by the first portion of the filter having a predefined spatial relationship with the second portion of the filter.

In accordance with a further embodiment of the invention, a system is disclosed comprising an electrical system including a filter, wherein the filter has an input for receiving an input signal including a plurality of different frequencies and an output for passing an output signal within a first frequency band to a portion of the electrical system; and a circuit coupled between the input of the filter and the output of the filter, wherein the circuit is for adding one or more zeros within a second frequency band to increase attenuation of the input signal within the second frequency band.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

Figure 1:
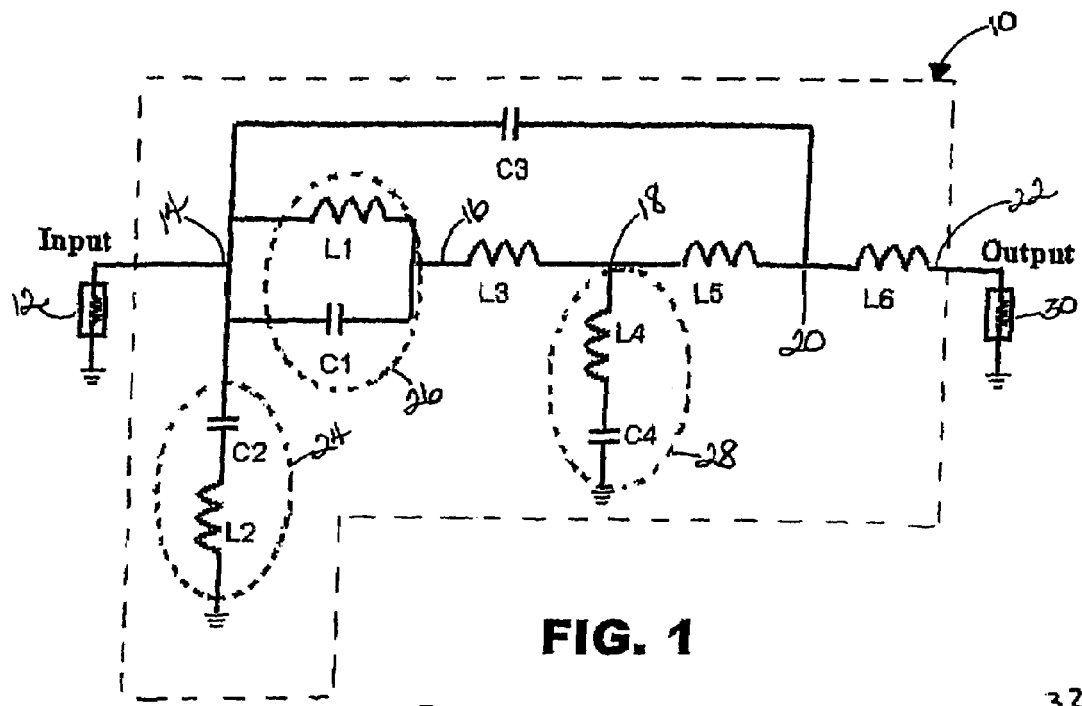
FIG. 1 is an electrical schematic of an embodiment of a filter, in accordance with systems and methods consistent with the present invention.

FIG. 1 is an electrical schematic of an embodiment of a filter 10, in accordance with systems and methods consistent with the present invention. Filter 10 may comprise a lowpass filter with an input node 14 and an output node 22, respectively coupled to an input load 12 coupled at an opposing node to ground and an output load 30 coupled at an opposing node to ground. Filter 10 may include a resonant circuit 24, a resonant circuit 26 and a resonant circuit 28. Resonant circuit 24 may include a capacitor C2 that may be coupled at one end to node 14 and coupled at another end in series with an inductor L2 that may be coupled to ground. Resonant circuit 26 may include a capacitor C1 that may be coupled in parallel with an inductor L1, between node 14 and a node 16. Resonant circuit 28 may include an inductor L4 that may be coupled at one end to a node 18 and coupled at another end in series with a capacitor C4 that may be coupled to ground. Filter 10 may also include inductors L3, L5 and L6 and a capacitor C3. Inductor L3 may be coupled between node 16 and node 18, while inductor L5 may be coupled between node 18 and a node 20. Inductor L6 may be coupled between node 20 and node 22. Capacitor C3 may be coupled between node 14 and node 20.

Figure 2:
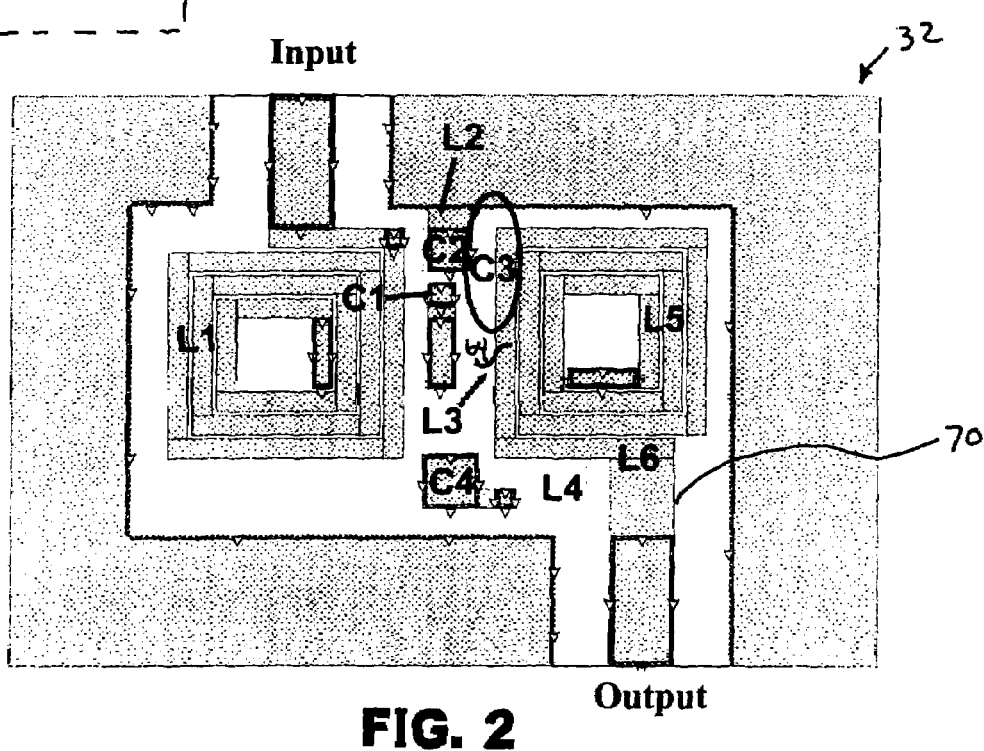
FIG. 2 is a plan view, including identifiers for the electrical components in the electrical schematic of FIG. 1, of a first material layer that may be used in a three-dimensional circuit layout providing an embodiment of the filter of FIG. 1, in accordance with systems and methods consistent with the present invention.

FIG. 2 is a plan view, including the identifiers for the electrical components in the electrical schematic of FIG. 1, of a material layer 32 that may be used in a three-dimensional circuit layout for providing an embodiment of filter 10, in accordance with systems and methods consistent with the present invention.

As shown in FIG. 2, filter 10 may comprise a lowpass filter, such as an elliptical-type lowpass filter that may employ thin-film elements, e.g., parallel plate capacitors such as C1, C2 and C4 and spiral inductors such as L1 and a combination of L5 and a portion of L6. The lowpass filter may improve rejection band performance by, for example, providing a coupling mechanism, e.g., capacitive and/or inductive, between the input and the output of filter 10. The coupling mechanism may add one or more attenuation zeros in the rejection band to increase attenuation in the rejection band.

As shown in FIG. 2, filter 10 may employ a capacitive coupling mechanism, e.g., capacitor C3, which may be provided by filter 10 itself, without using any additional components. For example, the coupling mechanism may be provided by having a first portion of filter 10, e.g., capacitor C2, located between resonant circuit 26 and a second portion of filter 10, e.g., inductor L6. Such an arrangement may not only introduce desirable capacitive coupling, but may also increase the distance between inductor L1 and inductor L5, consequently reducing undesirable inductive coupling.

The desired amount of capacitive coupling may be controlled by any technique. For desired capacitive coupling, one may employ a predefined size, shape, layout and/or material selection for the first and second portions of filter 10 that may be employed to provide the coupling mechanism. For example, by suitable spatial arrangement of a first portion of filter 10, e.g., capacitor C2, relative to a second portion of filter 10, e.g., inductor L6, one may control the amount of capacitive coupling. This may provide a coupling arrangement, e.g., edge-to-edge coupling, as identified by the elliptical region marked "C3" in FIG. 2. Such a coupling arrangement may be easier to control than overlapping the plates of a two-plate metal-insulator-metal (hereafter "MIM") capacitor, to provide a predefined amount of coupling, e.g., 0.01 pF to 0.5 pF in this embodiment of filter 10 which may comprise a lowpass filter with a cutoff frequency of approximately 2.4 GHz. Additionally, one may control the amount of capacitive coupling by the direction of rotation, e.g., clockwise or counterclockwise, as desired, of the output inductor coil, which may comprise inductor L5 and a portion of inductor L6.

From resonant circuit 24, FIG. 2 shows a portion, e.g. a plate, of capacitor C2, as well as inductor L2, which may comprise a layer of interconnect metal. Interconnect metal between circuit elements can add parasitic inductance, which may deteriorate filter performance. Filter 10 may use interconnect metal to form a useful circuit element, e.g., an inductor such as L2, which may be used to form a useful circuit, e.g., a resonant circuit such as resonant circuit 24, to achieve enhanced rejection performance. The inductance provided by such interconnect metals may be controlled by any technique, e.g., providing a predefined size, shape, layout and/or material selection for an interconnect metal to provide desired inductance.

From resonant circuit 26, FIG. 2 shows inductor L1, e.g. a spiral inductor, and a portion, e.g. a plate, of capacitor C1.

From resonant circuit 28, FIG. 2 shows inductor L4, e.g. interconnect metal (shown in dashed lines, indicating that the interconnect metal is formed on another layer, described below), and a portion, e.g. a plate, of capacitor C4.

Inductor L3, e.g. interconnect metal, is also shown in dashed lines, indicating that the interconnect metal is formed on another layer, described below. Inductor L5, e.g. a spiral inductor, is shown coupled to inductor L6, e.g. interconnect metal, which may comprise a metal interconnect portion 70 coupled to a metal portion 64, i.e., the L-shaped portion extending from the end of metal interconnect portion 70 to the elliptical region marked "C3" in FIG. 2. Capacitor C3 may be formed by a first portion of filter 10, e.g., a portion of capacitor C2, and a second portion of filter 10, e.g., part of L-shaped portion 64. The capacitance provided by capacitor C3 may be controlled by any technique, e.g., providing a predefined size, shape, layout and/or material selection for the first and second portions of filter 10 forming capacitor C3.

Figure 3:
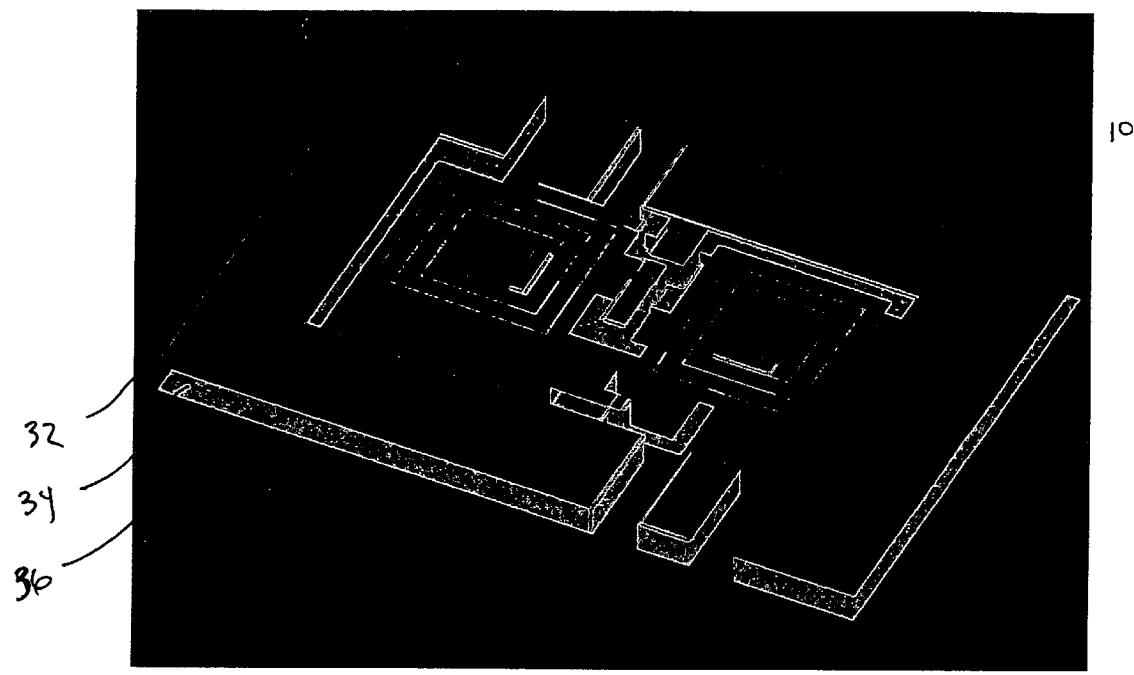
FIG. 3 is a perspective view of a three-dimensional circuit layout providing an embodiment of the filter of FIG. 1, in accordance with systems and methods consistent with the present invention.

FIG. 3 is a perspective view of a three-dimensional circuit layout providing an embodiment of filter 10, in accordance with systems and methods consistent with the present invention. Filter 10 may be fabricated by any known fabrication process to include one or more material layers, such as one or more layers of dielectric material and/or one or more layers of metallization material.

As shown in FIG. 3, filter 10 may include material layers 32-36. Material layer 32 may comprise one or more of any known metallization material. The layout of material layer 32 is further described below with reference to FIGS. 4A and 4B. Material layer 36 may also comprise one or more of any known metallization material. The layout of material layer 36 is further described below with reference to FIG. 4C. Material layer 34 may comprise one or more of any known dielectric material. The layout of material layer 34 is further described below with reference to FIGS. 9A-9B and 10A-10B, which depict process steps that may be used to fabricate embodiments filter 10.

Figure 4A:
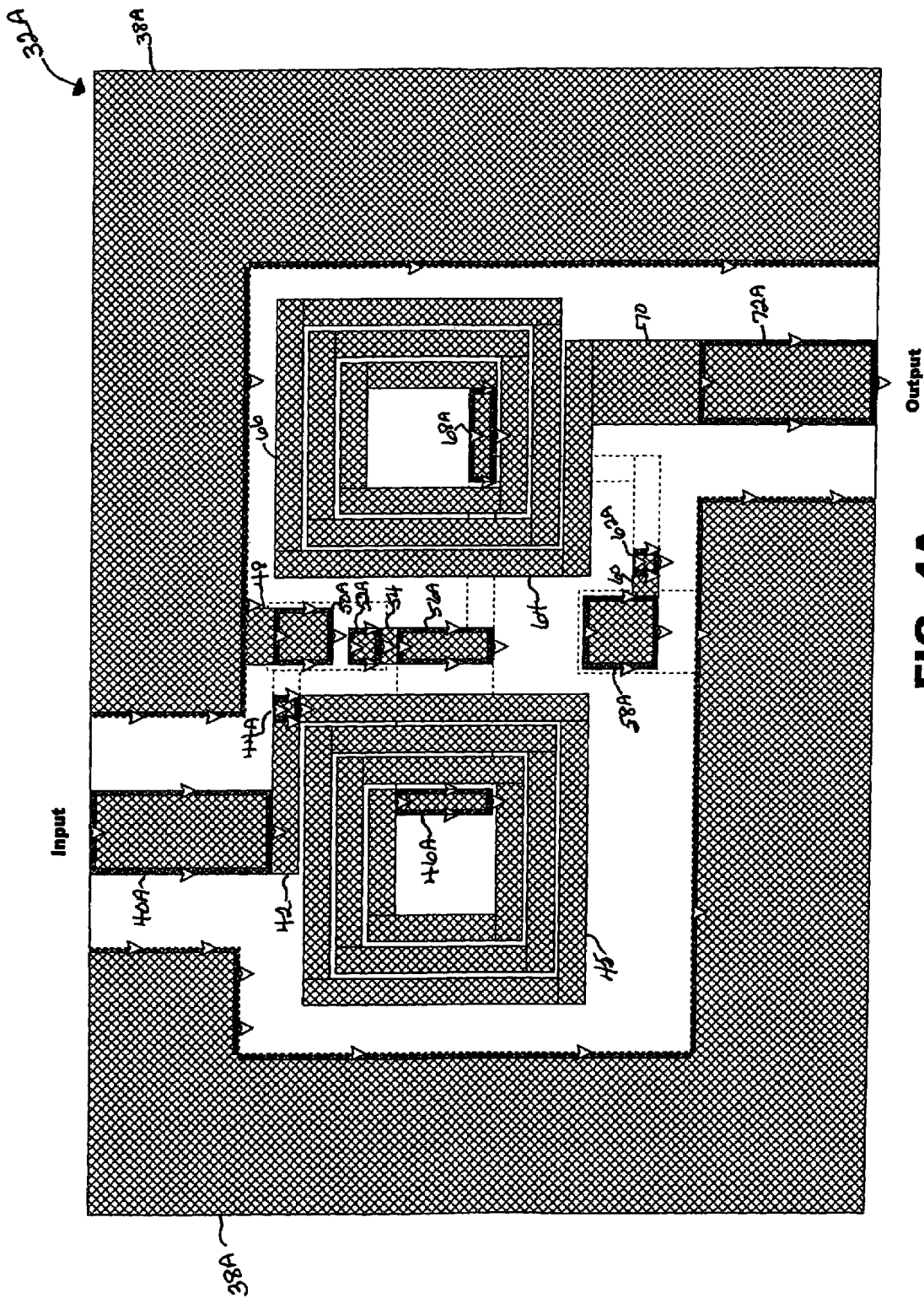
FIG. 4A is a plan view, without the identifiers for the electrical components in the electrical schematic of FIG. 1, of a first material layer that may be used in a three-dimensional circuit layout for providing an embodiment of the filter of FIG. 1, in accordance with systems and methods consistent with the present invention.
Figure 4B:
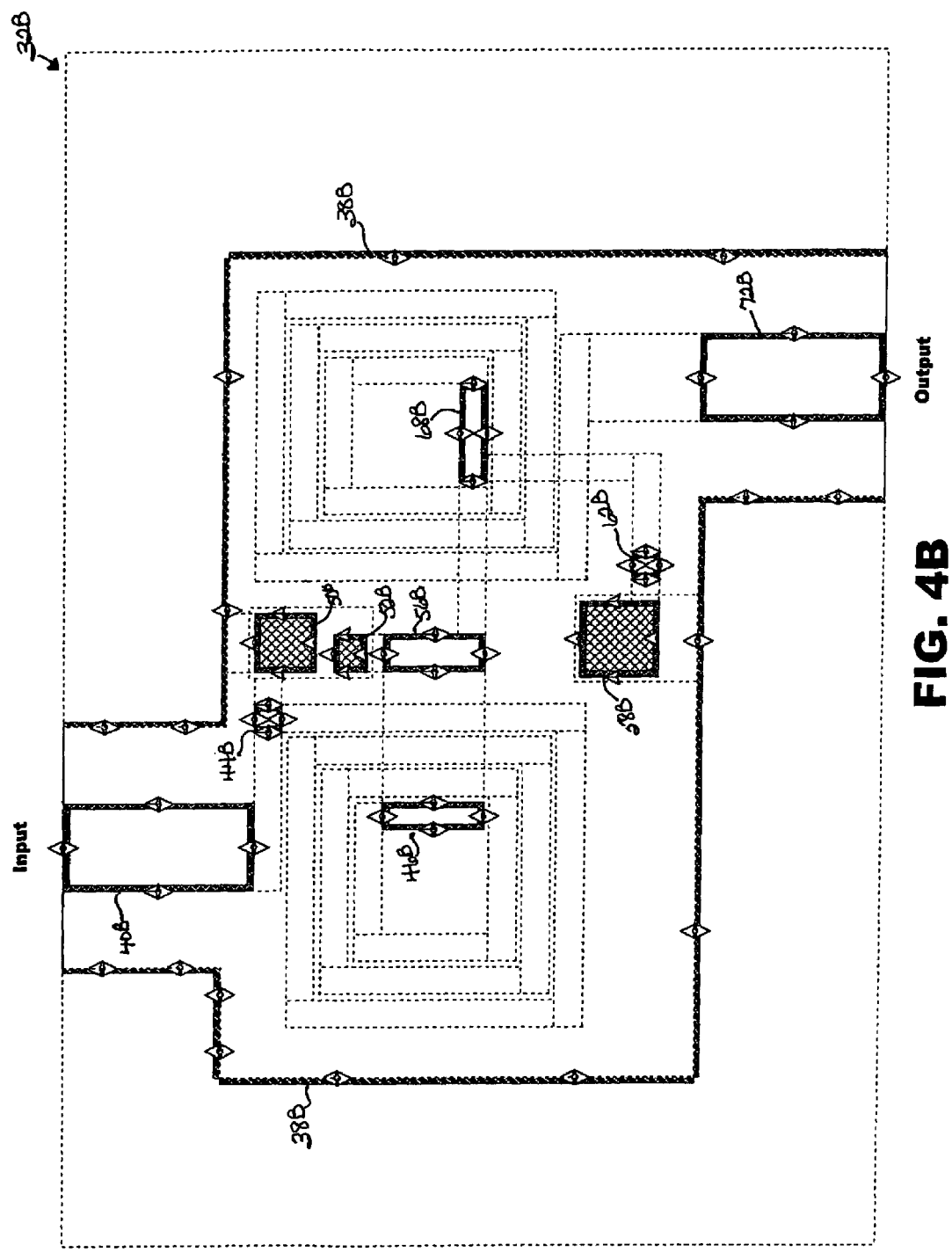
FIG. 4B is a plan view of a second material layer that may be used in a three-dimensional circuit layout for providing an embodiment of the filter of FIG. 1, in accordance with systems and methods consistent with the present invention.
Figure 4C:
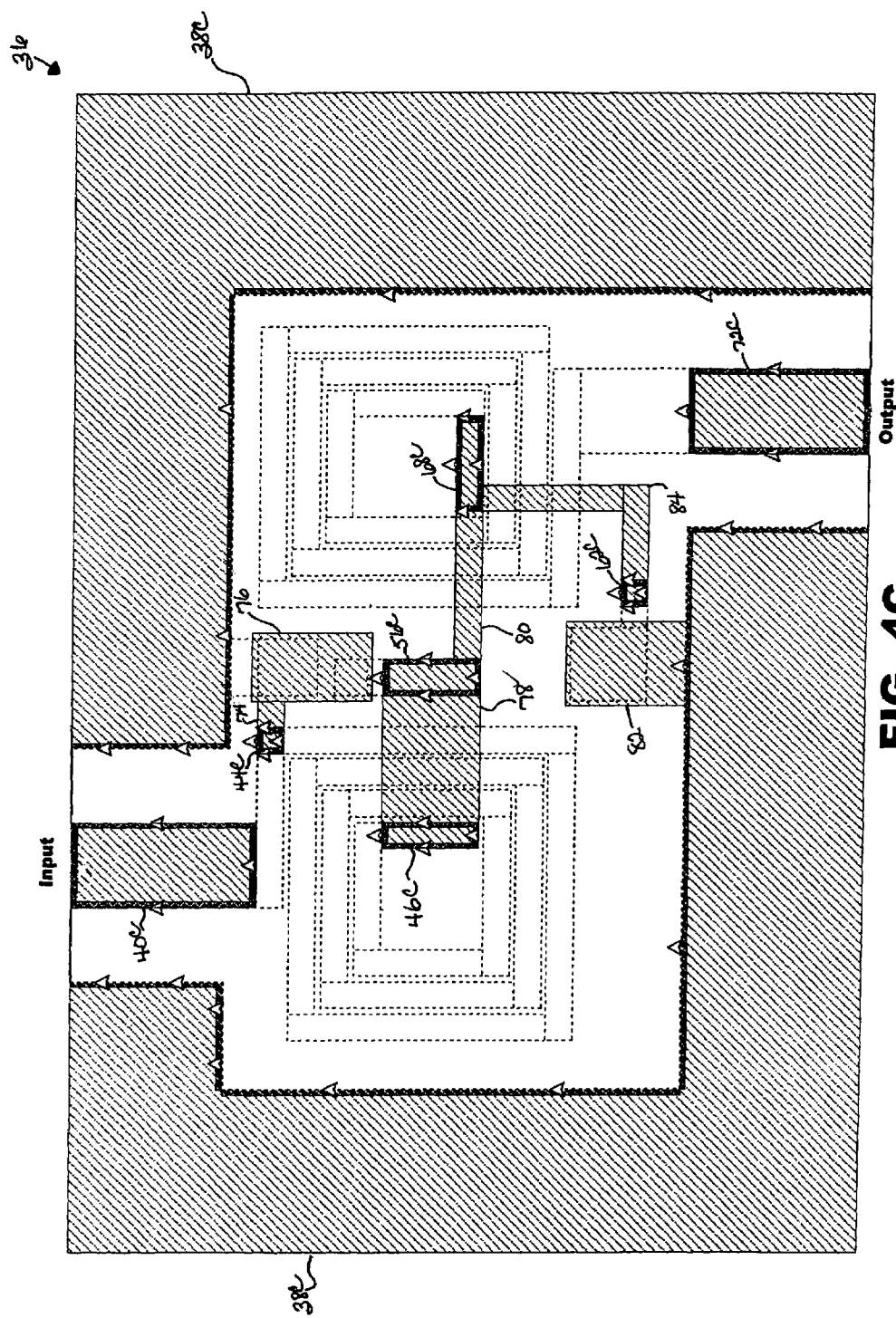
FIG. 4C is a plan view of a third material layer that may be used in a three-dimensional circuit layout for providing an embodiment of the filter of FIG. 1, in accordance with systems and methods consistent with the present invention.

FIGS. 4A-4C depict plan views of material layers that may be used in a three-dimensional circuit layout providing an embodiment of filter 10, in accordance with systems and methods consistent with the present invention. As shown in FIG. 3, filter 10 may include metallization material layers 32 and 36 on opposing surfaces of layer 34, which may comprise one or more layers of dielectric material. FIGS. 4A-4C were generated by a software application referred to as the Sonnet EM Suite, available from Sonnet Software, Inc. (hereafter the "Sonnet application"). The Sonnet application does not permit modeling two or more dielectric materials in the same plane, as material layer 34 may provide, shown by way of example in step 118 of FIG. 9B and step 216 of FIG. 10B. Due to this restriction of the Sonnet application, metallization layer 32 may be represented for purposes of computer simulation as layers 32A and 32B, shown in FIGS. 4A and 4B, respectively.

According to the Sonnet application, each of the darkened and/or shaded regions shown in layers 32A, 32B and 36 of FIGS. 4A-4C, respectively, may represent metallization material. The Sonnet application also provides a series of arrowheads shown in FIGS. 4A-4C, arrowheads pointing up, arrowheads pointing down and arrowheads pointing both up and down. According to the Sonnet application, upward-pointing arrowheads indicate that a metallization pattern bounded by the subject arrowheads is electrically coupled to a metallization pattern in an adjacent upper metallization pattern. Conversely, downward-pointing arrowheads indicate that a metallization pattern bounded by the subject arrowheads is electrically coupled to a metallization pattern in an adjacent lower metallization pattern. Arrowheads pointing both up and down indicate that a metallization pattern bounded by the subject arrowheads is electrically coupled to a metallization pattern in an adjacent upper metallization pattern and an adjacent lower metallization pattern.

Referring to FIGS. 4A-4C, metallization layer 32A may include a metallization pattern 38A that may be coupled through a metallization pattern 38B to a metallization pattern 38C in metallization layer 36. Metallization patterns 38A, 38B and 38C may comprise a ground plane for filter 10. Metallization patterns 38A and 38C may comprise plates, while metallization pattern 38B may comprise a pattern of vertical interconnection between metallization patterns 38A and 38C.

Metallization layer 32A may include a metallization pattern 40A that may be coupled through a metallization pattern 40B to a metallization pattern 40C in metallization layer 36. Metallization patterns 40A, 40B and 40C may comprise an input for filter 10. Metallization patterns 40A and 40C may comprise plates, while metallization pattern 40B may comprise a pattern of interconnection between metallization patterns 40A and 40C.

Metallization layer 32A may include a metallization pattern 72A that may be coupled through a metallization pattern 72B to a metallization pattern 72C in metallization layer 36. Metallization patterns 72A, 72B and 72C may comprise an output for filter 10. Metallization patterns 72A and 72C may comprise plates, while metallization pattern 72B may comprise a pattern of interconnection between metallization patterns 72A and 72C.

As shown in FIG. 1, resonant circuit 24 may include capacitor C2 that may be coupled at one end to node 14 and coupled at another end in series with inductor L2 that may coupled to ground. Capacitor C2 may include a first plate that may be formed by metallization patterns 50A and 50B and a second plate that may be formed by a portion of metallization pattern 76. The circuit layout from the filter input to capacitor C2, as shown in FIG. 1, may include metallization patterns 40A, 42, 44A, 44B, 44C, 74 and 76. A portion of metallization pattern 76, e.g., a plate, may form a first end of capacitor C2.

A second end of capacitor C2 may be formed by metallization patterns 50A and 50B, e.g., patterns 50A and 50B forming a plate of capacitor C2. In layer 32A, metallization pattern 50A may be coupled to metallization pattern 48, which may provide an inductance for inductor L2 coupled to ground plane 38A.

Resonant circuit 26, as shown in FIG. 1, may include capacitor C1 that may be coupled in parallel with inductor L1, between node 14 and node 16. Capacitor C1 may include a first plate that may be formed by metallization patterns 52A and 52B and a second plate that may be formed by a portion of metallization pattern 76. The circuit layout from the filter input to capacitor C1, as shown in FIG. 1, may include metallization patterns 40A, 42, 44A, 44B, 44C, 74 and 76. A portion of metallization pattern 76, e.g., a plate, may form a first end of capacitor C1. A second end of capacitor C1 may be formed by metallization patterns 52A and 52B, e.g., patterns 52A and 52B forming a plate of capacitor C1. Inductor L1 may include metallization patterns 44A, 45 and 46A, which together may form a spiral inductor L1. A first end of inductor L1 may be coupled to capacitor C1 through metallization patterns 44A, 44B, 44C and 74. A second end of inductor L1 may be coupled to capacitor C1 through metallization patterns 46A, 46B, 46C, 78, 56C, 56B, 56A and 54.

Resonant circuit 28, as shown in FIG. 1, may include inductor L4 that may be coupled at a first end to node 18 and coupled at a second end in series with capacitor C4 that may be coupled to ground. Capacitor C4 may include a first plate that may be formed by metallization patterns 58A and 58B and a second plate that may be formed by a portion of metallization pattern 82. A first end of capacitor C4 may be coupled to ground plane 38C though a portion of metallization pattern 82. A second end of capacitor C4 may be coupled to inductor L4 by metallization patterns 60, 62A, 62B and 62C.

Inductor L4 may include metallization pattern 84. In this case, an end of inductor L4, i.e., the end at node 18, as shown in FIG. 1, may be coupled to inductor L3 and inductor L5. Inductor L3 may include metallization pattern 80, which may be coupled to inductor L4 through metallization pattern 68C. Inductor L5 may include metallization patterns 66 and 68A, which together may form a spiral inductor L5. A first end of inductor L5 may be coupled to inductor L4 through metallization patterns 68B and 68C. A second end of inductor L5 may be coupled to inductor L6, which may include metallization patterns 64 and 70. Metallization pattern 64 may comprise the L-shaped metallization pattern extending from the end of metallization pattern 70 to the elliptical region marked "C3" in FIG. 2. Capacitor C3 may be formed by a first portion of filter 10, e.g., a portion of capacitor C2, and a second portion of filter 10, e.g., part of L-shaped metallization pattern 64. The capacitance provided by capacitor C3 may be controlled by any technique, e.g., providing a predefined size, shape, layout and/or material selection for the first and second portions of filter 10 forming capacitor C3. An end of inductor L6, i.e., the end at node 22 as shown in FIG. 1, may be coupled to the output which may include metallization patterns 72A, 72B and 72C.

Figure 5A:
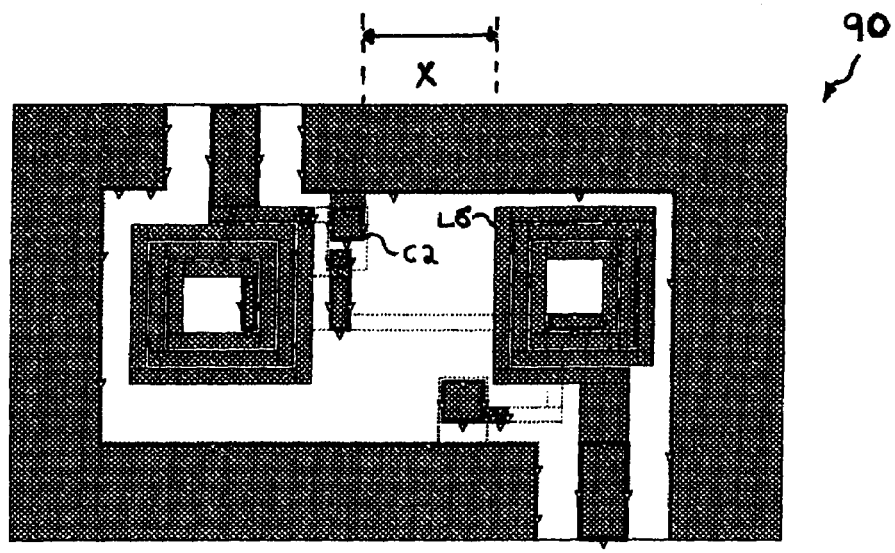
FIGS. 5A and 5B are plan views of a first material layer that may be used in a three-dimensional circuit layout, the layout in FIG. 5A providing insufficient input-output coupling to provide an embodiment of the filter of FIG. 1, while the layout in FIG. 5B provides sufficient input-output coupling to provide an embodiment of the filter of FIG. 1, in accordance with systems and methods consistent with the present invention.
Figure 5B:
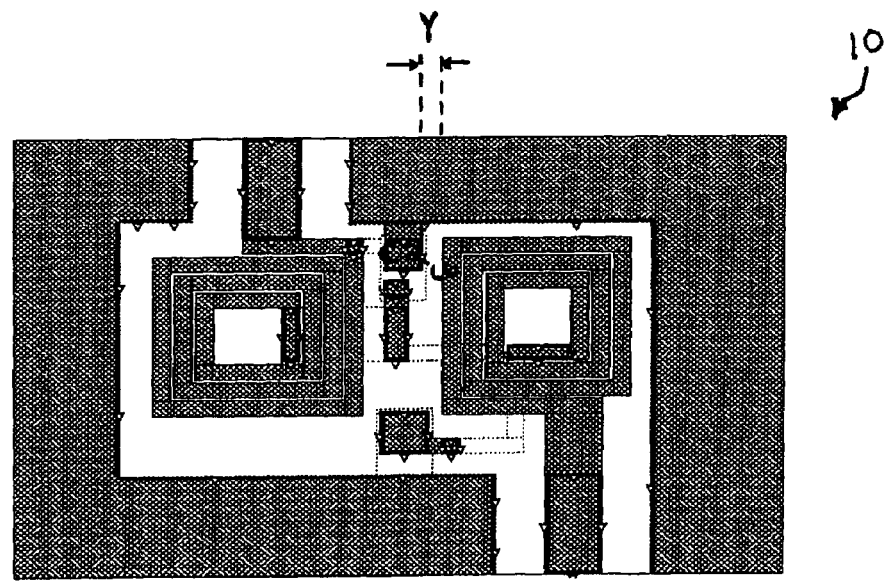

FIGS. 5A and 5B are plan views of a first material layer that may be used in a three-dimensional circuit layout. The circuit layout of FIG. 5A does not provide input-output coupling, as may be provided by an embodiment of filter 10. Instead, the circuit layout of FIG. 5A may provide a filter 90 that may have the same electrical schematic as filter 10, as shown in FIG. 1, except that filter 90 would not include input-output coupling through capacitor C3. As shown in FIG. 5A, a distance "X" between capacitor C2 and inductor L6 exceeds a desired range for effective input-output capacitive coupling.

In contrast, the layout of FIG. 5B may have sufficient input-output coupling to provide an embodiment of filter 10, in accordance with systems and methods consistent with the present invention. Filter 10 may provide input-output coupling by any suitable means, including capacitive coupling that may use one or more capacitors, inductive coupling that may use one or more inductors, or a combination thereof that may use one or more capacitors and one or more inductors.

For example, as shown in FIGS. 1 and 2, an embodiment of filter 10 may provide input-output coupling that uses one or more capacitors, i.e., capacitive input-output coupling through capacitor C3. Capacitor C3 may be formed by a first portion of filter 10, e.g., a portion of capacitor C2, and a second portion of filter 10, e.g., a portion of inductor L6. The capacitance of capacitor C3 may be controlled by any technique, e.g., providing a predefined size, shape, layout and/or material selection for the first and second portions of filter 10 forming capacitor C3.

As shown in FIG. 5B, a distance "Y" between capacitor C2 and inductor L6 may fall within a desired range for effective input-output capacitive coupling. In the case where filter 10 comprises a lowpass filter with thin-film elements laid out, as shown in FIGS. 4A-4C, with a cutoff frequency of approximately 2.4 GHz, this desired range may comprise a distance of up to approximately 100 times the metal layer thickness of any metallization pattern forming capacitor C2 or inductor L6, whichever is greater. This desired range may vary, according to the cutoff frequency, e.g., the desired range may be inversely-proportional to the cutoff frequency.

Figure 6:
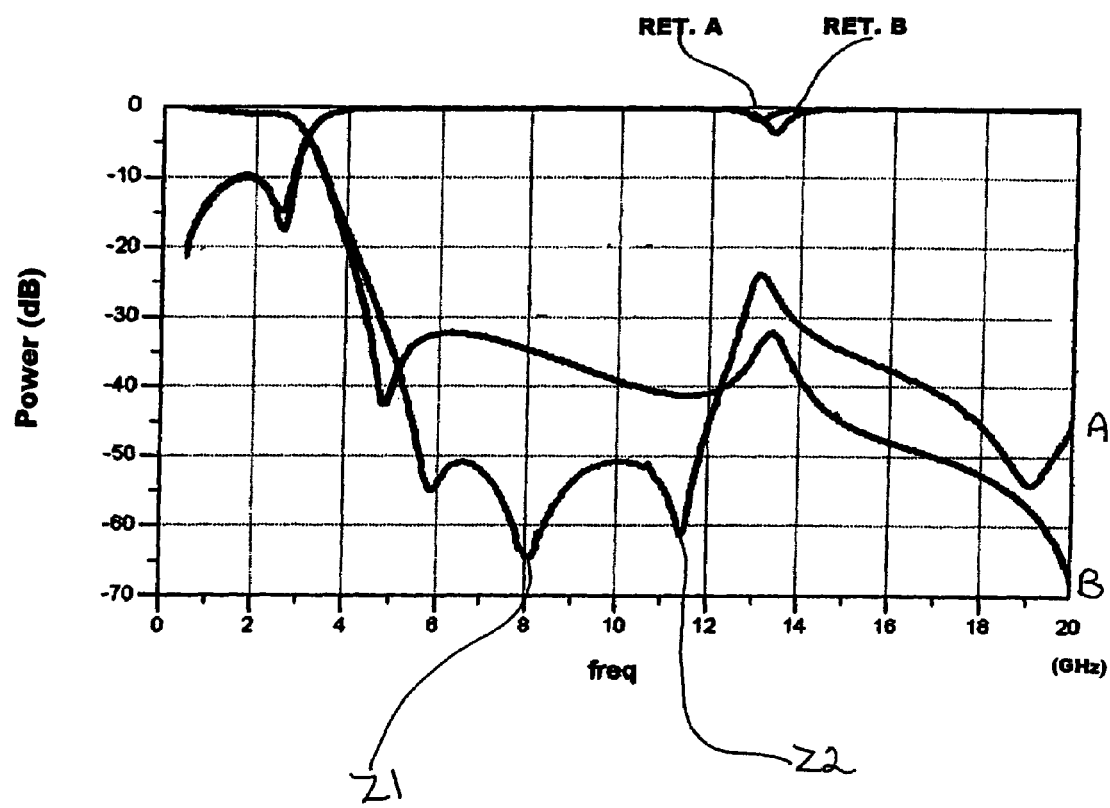
FIG. 6 is a frequency response diagram for an embodiment of the filter of FIG. 1, in accordance with systems and methods consistent with the present invention.

FIG. 6 is a frequency response diagram of an embodiment of filter 10, in accordance with systems and methods consistent with the present invention. FIG. 6 also includes a frequency response diagram for filter 90, as shown in FIG. 5A, and represented in electrical-schematic form by FIG. 1, without capacitor C3. The frequency response diagrams for filters 10 and 90 may be obtained by a computer simulation, which may input a predefined signal to computer simulations of filters 10 and 90, such as a 0 to 20 GHz swept-frequency signal. Plot "A" represents transmission loss versus frequency for filter 10, while transmission loss versus frequency for filter 90 is represented by plot "B." The plots labeled "RET. A" and "RET. B" represent the return loss of the input signal at the inputs to filters 10 and 90, respectively.

The computer simulation may use for the resistors, capacitors and inductors of filter 10 the following component values: $R_{IN}$=50 ohms, $R_{OUT}$=50 ohms, C1=0.49 pF, C2=1.18 pF, C3=0.019 pF, C4=2.59 pF, L1=2.08 nH, L2=0.057 nH, L3=0.44 nH, L4=0.066 nH, L5=1.87 nH and L6=0.76 nH. The Q-factors for the foregoing inductors and capacitors may comprise 22 and 100, respectively. The computer simulation may use for the resistors, capacitors and inductors of filter 90 the same component and Q-factor values, however, capacitor C3 would be absent in filter 90.

The frequency response plots for filters 10 and 90 both exhibit lowpass-filter characteristics. However, plot A for filter 10 shows increased signal attenuation of frequencies in a rejection band, e.g., frequencies greater than 3.0 GHz. Moreover, plot A for filter 10 includes an additional zero, relative to the rejection band in plot B for filter 90. Specifically, plot A for filter 10 shows an additional zero Z1 located at approximately 8 GHz. Zero Z2 located at approximately 11.5 GHz is better pronounced and its position tuned in plot A.

Figure 7:
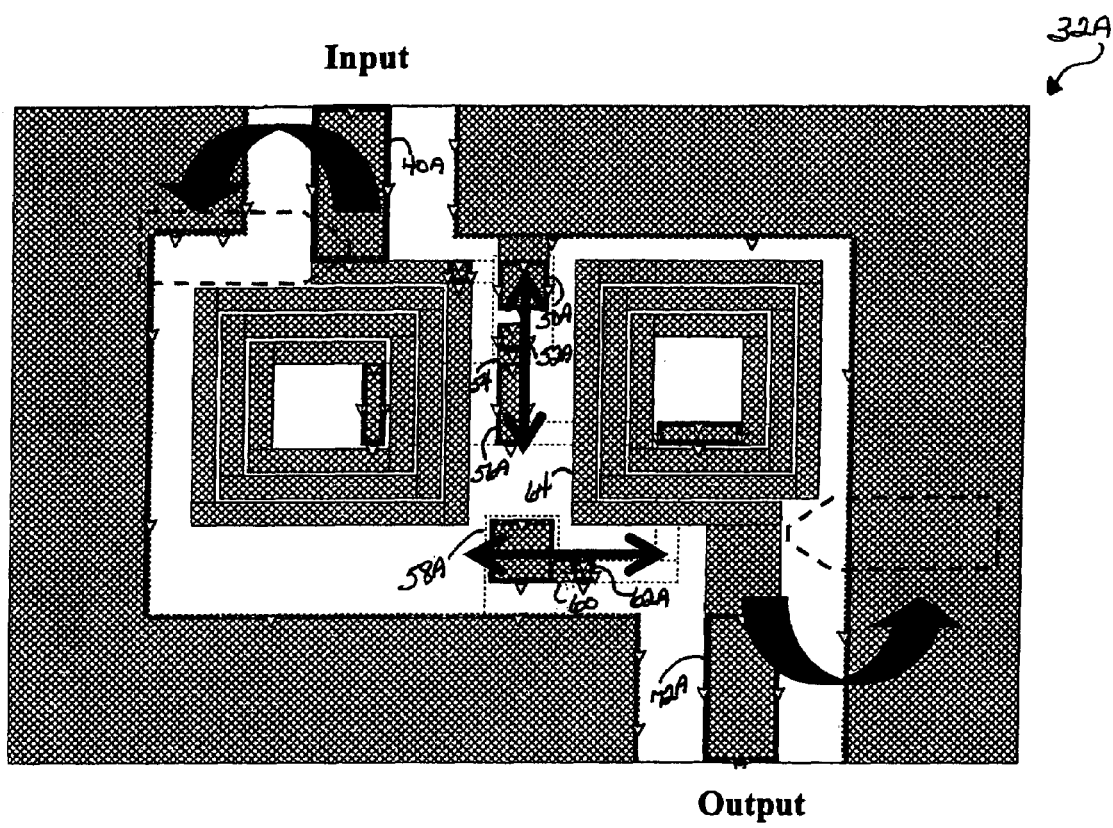
FIG. 7 is a plan view depicting variations that may be employed to a first material layer that may be used in a three-dimensional circuit layout for providing an embodiment of the filter of FIG. 1, in accordance with systems and methods consistent with the present invention.

FIG. 7 is a plan view depicting variations that may be employed to material layer 32A that may be used in a three-dimensional circuit layout providing an embodiment of filter 10, in accordance with systems and methods consistent with the present invention. In a variation, metallization pattern 40A may be rotated and/or extended, as indicated, which may provide more convenient coupling to an outside circuit or termination. In another variation, one or more of metallization patterns 50A, 52A, 54 and 56A may be moved, either direction as indicated, which may alter the location of the region where coupling with metallization pattern 64 may occur, thus altering the inductance values for inductor L5 and inductor L6, as well as filter performance. In still another variation, one or more of metallization patterns 58A, 60 and 62A may be moved, either direction, as indicated, which may alter the inductance value of inductor L4 and/or rearrange the shape of filter 10. In another variation, metallization pattern 72A may be rotated, as indicated, which may provide more convenient coupling to an outside circuit or termination. Selected variations in material layer 32A may have corresponding variations employed in material layers 32B and 36.

Figure 8:
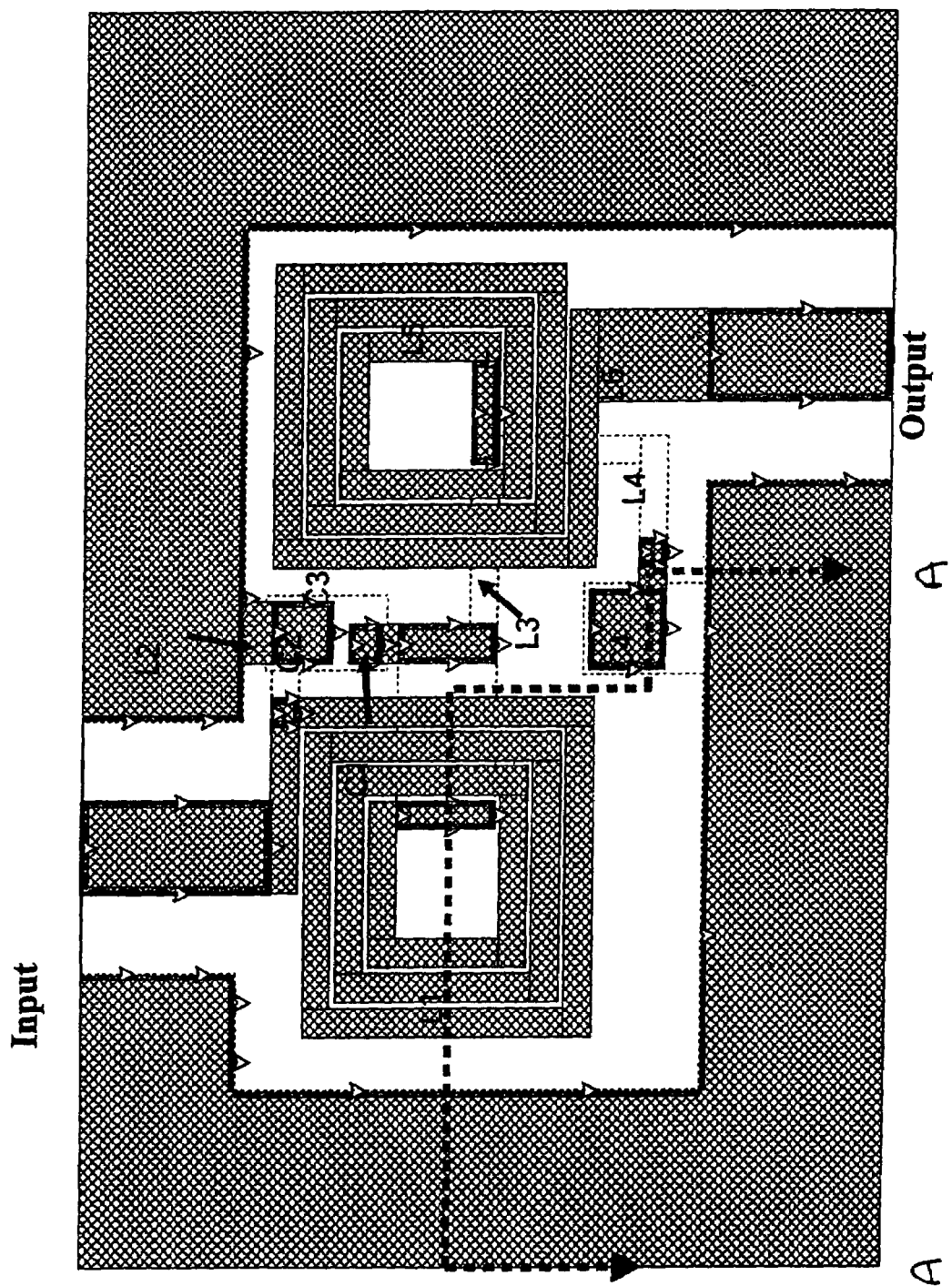
FIG. 8 is a plan view, including a cross section taken through dashed-line indicator A-A, of a first material layer that may be used in a three-dimensional circuit layout for providing an embodiment of the filter of FIG. 1, in accordance with systems and methods consistent with the present invention.
Figure 9A:
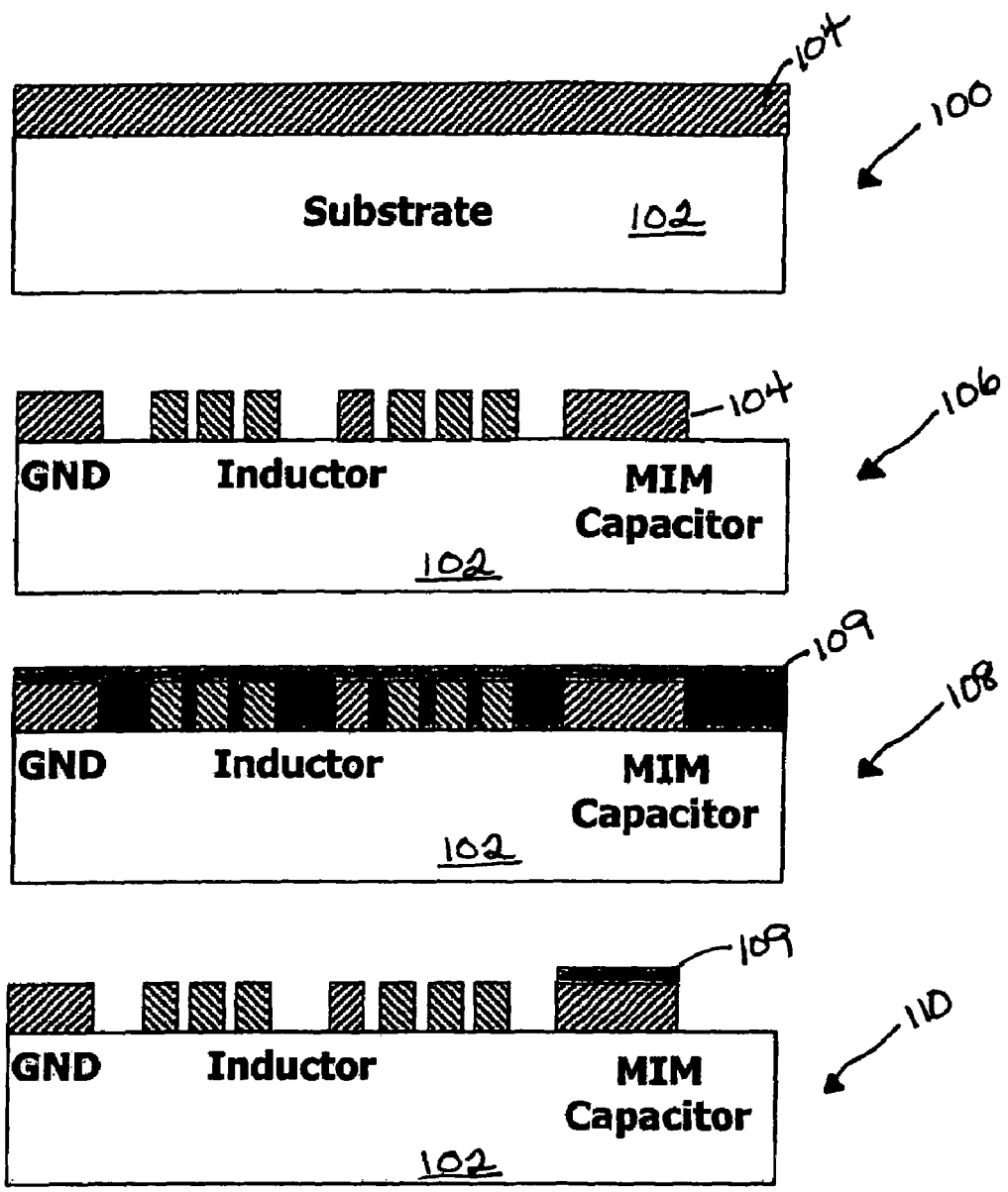
FIGS. 9A and 9B are cross-sectional views, taken along the line A-A of FIG. 8, depicting process steps that may be used to fabricate an embodiment of the filter of FIG. 1, in accordance with systems and methods consistent with the present invention.
Figure 9B:
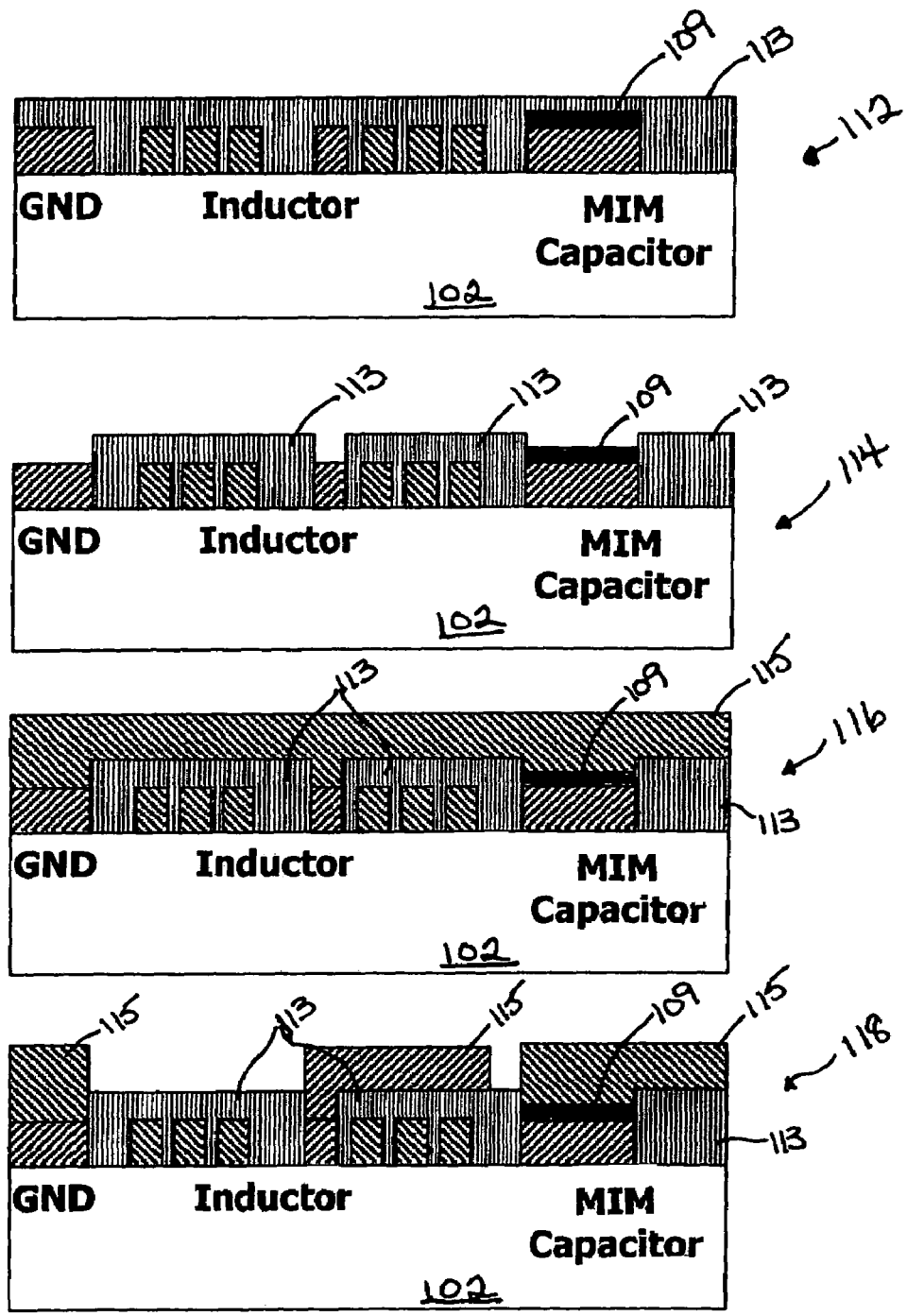

FIGS. 9A and 9B are cross-sectional views, taken along the line A-A of FIG. 8, depicting process steps that may be used to fabricate an embodiment of filter 10, in accordance with systems and methods consistent with the present invention. Any fabrication process steps may be employed. For example, in step 100, a first metal layer 104 may be deposited on a substrate 102 of any kind or thickness, which may comprise alumina having an approximate thickness of 0.5 mm. In step 106, patterning and etching may be employed to form metallization patterns for a ground plane, an inductor and a MIM capacitor. In step 108, one may sputter a capacitor dielectric 109 of any kind or thickness, such as $Si_3N_4$ of an approximate thickness of 1000 Angstroms. In step 110, one may pattern and etch capacitor dielectric 109, leaving dielectric 109 on a portion of a MIM capacitor. In step 112, one may spin on insulator layer 113 of any kind or thickness, such as a layer of polyimide 3 um thick. In step 114, one may pattern, etch and cure insulator layer 113. In step 116, a second metal layer 115 may be deposited, and in step 118, one may pattern and etch second metal layer 115. This embodiment of filter 10 provides the coils of an inductor with first metal layer 104, as opposed to providing the coils of an inductor with a second metal layer, as depicted in FIGS. 10A-10B, which correspond to filter 10, as shown in FIGS. 4A-4C.

Figure 10A:
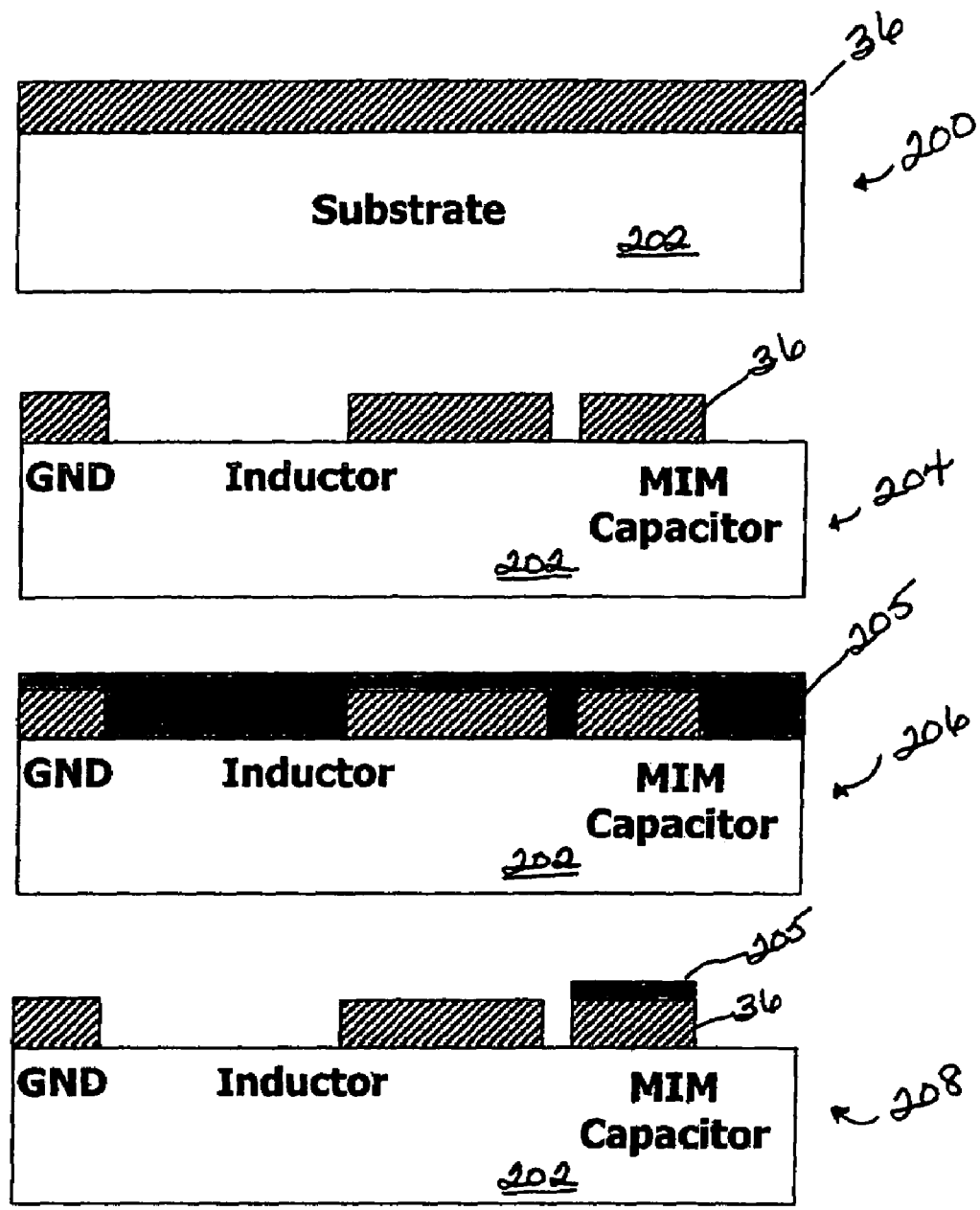
FIGS. 10A and 10B are cross-sectional views, taken along the line A-A of FIG. 8, depicting process steps that may be used to fabricate another embodiment of the filter of FIG. 1, in accordance with systems and methods consistent with the present invention.
Figure 10B:
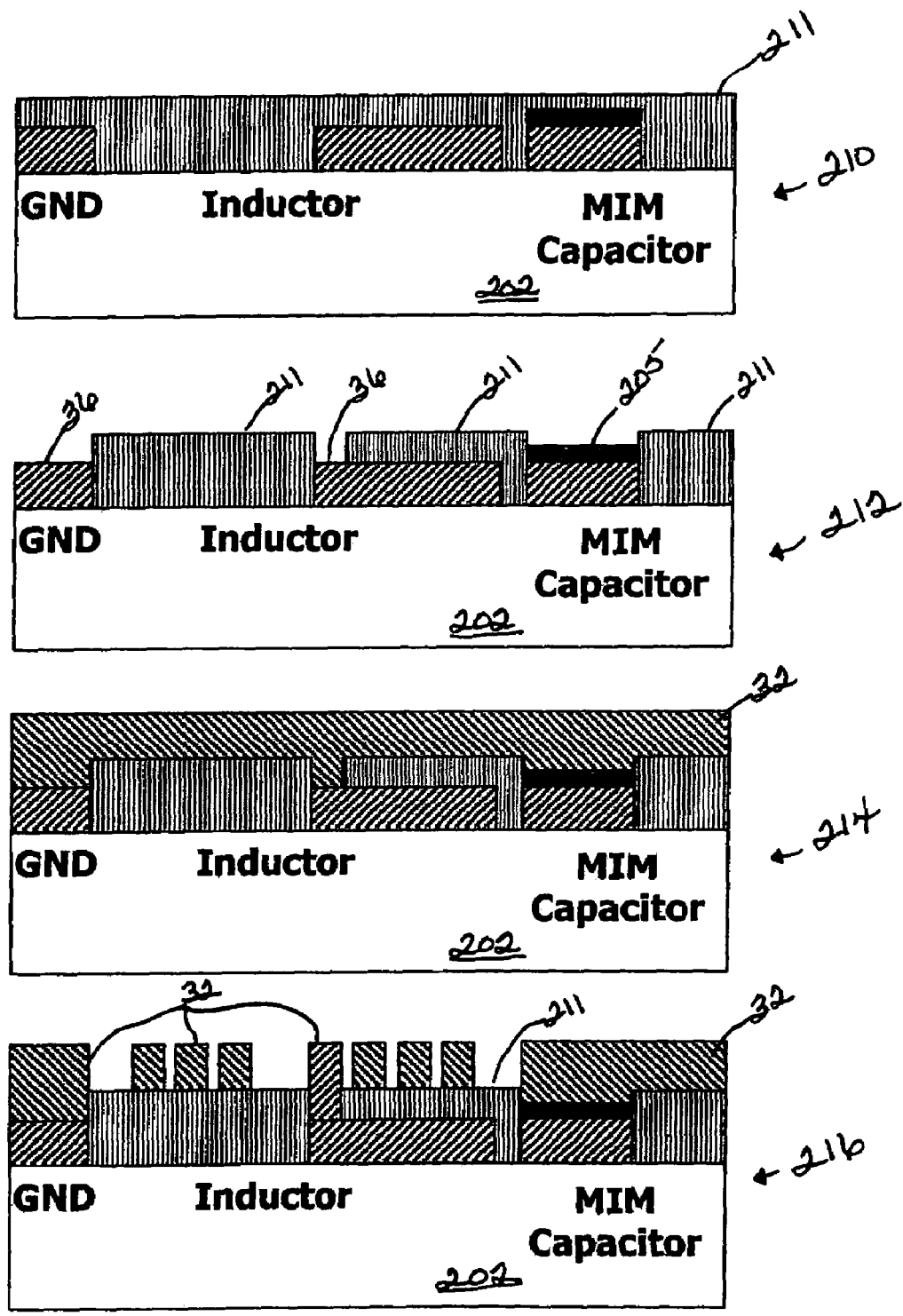

FIGS. 10A and 10B are cross-sectional views, taken along the line A-A of FIG. 8, depicting alternative process steps that may be used to fabricate an embodiment filter 10, in accordance with systems and methods consistent with the present invention. Any fabrication process steps may be employed. For example, in step 200, a first metal layer 36, as shown in FIG. 4C, may be deposited on a substrate 202 of any kind or thickness, which may comprise alumina having an approximate thickness of 0.5 mm. In step 204, patterning and etching may be employed to form metallization patterns for a ground plane, an inductor and a MIM capacitor. In step 206, one may sputter a capacitor dielectric 205 of any kind or thickness, such as $Si_3N_4$ of an approximate thickness of 1000 Angstroms. In step 208, one may pattern and etch capacitor dielectric 205, leaving dielectric 205 on a portion of a MIM capacitor. In step 210, one may spin on an insulator layer 211 of any kind or thickness, such as a layer of polyimide 3 um thick. In step 212, one may pattern, etch and cure insulator layer 211. In step 214, a second metal layer 32 may be deposited, and in step 216, one may pattern and etch second metal layer 32.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A device, comprising:
   a filter having an input for receiving an input signal including a plurality of different frequencies and an output for passing an output signal within a first frequency band; and
   a reactive coupling component coupled between the input of the filter and the output of the filter, the reactive coupling component for adding one or more zeros within a second frequency band to increase attenuation of the input signal within the second frequency band, wherein the reactive coupling component is directly connected to the input, and wherein the reactive coupling component is formed by:
   (a) a metal element of a first component of the filter;
   (b) a metal element of a second component of the filter, wherein the metal elements of the first component and second component are within a predetermined proximity and a predetermined orientation to each other; and
   (c) one of:
   a uniform dielectric between the first component and second component; and
   a uniform metal trace connecting the first component and the second component.

2. The device of claim 1 wherein the filter comprises at least one of a lowpass filter, a highpass filter and a bandpass filter.

3. The device of claim 1 wherein the reactive coupling component comprises at least one of a capacitor and an inductor.

4. The device of claim 1 wherein the first frequency band does not include any frequency in the second frequency band.

5. The device of claim 1 wherein the reactive coupling component is not directly connected to the output.

6. The device of claim 5 wherein the reactive coupling component is coupled to the output through a portion of the filter.

7. The device of claim 1 wherein the first component comprises a capacitor.

8. The device of claim 7 wherein the capacitor comprises a parallel plate capacitor.

9. The device of claim 7 wherein the second component comprises an inductor.

10. The device of claim 9 wherein the inductor comprises a spiral inductor.

11. The device of claim 9 wherein the reactive coupling component is a capacitor.

12. The device of claim 1 wherein the filter comprises a plurality of capacitors and a plurality of inductors.

13. The device of claim 12 wherein the plurality of capacitors and the plurality of inductors comprise thin-film elements.

14. The device of claim 12 wherein the first component is one of the plurality of capacitors and the second component is one of the plurality of inductors.

15. The device of claim 14 wherein the reactive coupling component is a capacitor.

16. The device of claim 15 wherein the first component and second component are a pair of the plurality of inductors.

17. A device, comprising:

a filter having an input for receiving an input signal including a plurality of different frequencies and an output for passing an output signal within a first frequency band; and a reactive coupling component coupled between the input of the filter and the output of the filter, the reactive coupling component for adding one or more zeros within a second frequency band to increase attenuation of the input signal within the second frequency band, wherein the reactive coupling component is formed by:

(a) a metal element of a first component of the filter;

(b) a metal element of a second component of the filter, wherein the metal elements of the first component and second component are within a predetermined proximity and a predetermined orientation to each other; and (c) one of:

a uniform dielectric between the first component and second component; and a uniform metal trace connecting the first component and the second component, wherein the first component comprises a capacitor and the second component comprises a spiral inductor.

* * * * *